(12) United States Patent
Vockenberger

(10) Patent No.: US 11,171,070 B2
(45) Date of Patent: Nov. 9, 2021

(54) COMPONENT CARRIER WITH INTEGRATED THERMALLY CONDUCTIVE COOLING STRUCTURES

(71) Applicant: AT & S Austria Technologie & Systemtechnik Aktiengesellschaft, Leoben (AT)

(72) Inventor: Christian Vockenberger, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/014,278

(22) Filed: Jun. 21, 2018

(65) Prior Publication Data

US 2019/0393117 A1   Dec. 26, 2019

(51) Int. Cl.
| | | |
|---|---|---|
| H01L 23/367 | (2006.01) | |
| H01L 23/373 | (2006.01) | |
| H01L 23/498 | (2006.01) | |

(52) U.S. Cl.
CPC ........ *H01L 23/367* (2013.01); *H01L 23/3736* (2013.01); *H01L 23/49822* (2013.01); *H01L 23/49838* (2013.01); *H01L 23/49872* (2013.01)

(58) Field of Classification Search
CPC .............. H01L 23/367; H01L 23/3736; H01L 23/49838; H01L 23/49872; H01L 23/49822; H01L 23/3677; H01L 24/48; H01L 23/49827; H01L 23/49816; H01L 23/5389; H01L 24/73; H01L 24/16; H01L 24/32; H01L 23/3128; H01L 24/13
See application file for complete search history.

(56) References Cited

U.S. PATENT DOCUMENTS

| | | | |
|---|---|---|---|
| 5,306,670 A | 4/1994 | Mowatt et al. | |
| 6,400,573 B1* | 6/2002 | Mowatt | ............... H01L 23/5383 361/719 |
| 6,473,936 B2 | 11/2002 | Goenka et al. | |
| 2007/0284711 A1* | 12/2007 | Lee | .......... H01L 24/25 257/678 |
| 2009/0108435 A1* | 4/2009 | Bernstein | ............ H01L 25/0657 257/691 |
| 2010/0025082 A1* | 2/2010 | Sasaoka | ............... H05K 1/0206 174/252 |

(Continued)

FOREIGN PATENT DOCUMENTS

| | | |
|---|---|---|
| EP | 1 276 357 A2 | 1/2003 |
| JP | 2012028421 A | 2/2012 |

OTHER PUBLICATIONS

Extended European Search Report in EP 19 178 666.4 dated Nov. 25, 2019; pp. 1-8; European Patent Office, 80298, Munich, Germany.

(Continued)

*Primary Examiner* — Samuel Park
(74) *Attorney, Agent, or Firm* — Robert A. Blaha; Smith Tempel Blaha LLC

(57) ABSTRACT

A component carrier having a stack with at least one electrically insulating layer structure and/or at least one electrically conductive layer structure and an array of exposed highly thermally conductive cooling structures integrally formed with the stack and defining cooling channels in between is disclosed.

12 Claims, 1 Drawing Sheet

(56) References Cited

U.S. PATENT DOCUMENTS

| | | | | |
|---|---|---|---|---|
| 2011/0176280 | A1* | 7/2011 | Lee | H01L 23/3677 361/721 |
| 2011/0272824 | A1* | 11/2011 | Pagaila | H01L 21/565 257/777 |
| 2013/0143067 | A1* | 6/2013 | Kim | B82Y 30/00 428/634 |
| 2013/0228914 | A1* | 9/2013 | Di Stefano | F28F 3/00 257/712 |
| 2014/0078703 | A1* | 3/2014 | Kim | H01L 24/19 361/761 |
| 2014/0106561 | A1* | 4/2014 | Niyogi | H01L 21/76867 438/643 |
| 2014/0218868 | A1 | 8/2014 | Holma et al. | |
| 2015/0085446 | A1* | 3/2015 | Hable | H05K 1/021 361/719 |
| 2015/0201500 | A1 | 7/2015 | Shinar et al. | |
| 2016/0027764 | A1* | 1/2016 | Kim | H01L 24/97 257/686 |
| 2016/0275762 | A1* | 9/2016 | Kuenzi | G08B 13/02 |
| 2017/0154878 | A1* | 6/2017 | Kim | H01L 25/50 |
| 2017/0223819 | A1 | 8/2017 | Sun et al. | |
| 2017/0309540 | A1 | 10/2017 | Temmei et al. | |
| 2017/0325327 | A1 | 11/2017 | Smith et al. | |
| 2017/0347458 | A1 | 11/2017 | Lai et al. | |
| 2019/0074264 | A1* | 3/2019 | Chen | H01L 25/0657 |
| 2019/0115325 | A1* | 4/2019 | Im | H01L 25/105 |
| 2019/0139854 | A1* | 5/2019 | Wu | H01L 23/49822 |

OTHER PUBLICATIONS

Dardel, B.; Communication Pursuant to Article 94(3) EPC in Application No. 19 178 666.4; pp. 1-9; Jul. 1, 2021; European Patent Office; Postbus 5818, 2280 HV Rijswijk, Netherlands.

* cited by examiner

COMPONENT CARRIER WITH INTEGRATED THERMALLY CONDUCTIVE COOLING STRUCTURES

TECHNICAL FIELD

Embodiments of the invention relate to a component carrier comprising a thermally conductive cooling structure and to a method of manufacturing a component carrier comprising a cooling structure.

TECHNOLOGICAL BACKGROUND

A component carrier, such as a printed circuit board (PCB) or a substrate, mechanically supports and electrically connects electronic components. Electronic components are mounted on the component carrier and are interconnected to form a working circuit or electronic assembly.

Component carriers can be single sided or double sided component carriers or can have a multi-layer design. Advantageously, multi-layer component carriers allow a high component density which becomes nowadays, in times of an ongoing miniaturization of electronic components, more and more important. Conventional component carriers known form the state of the art comprise a laminated stack with a plurality of electrically insulating layer structures and a plurality of electrically conductive layer structures. The electrically conductive layers are usually connected to each other by so called microvias or plated-through holes. A conductive copper layer on the surface of the laminated stack forms an exposed structured copper surface. The exposed structured copper surface of the laminated stack is usually covered with a surface finish which completely covers the exposed structured copper surface.

However, due to the high density of components in the component carrier and in particular in high-power components, heat management becomes more important. Efficient and integrated cooling is more and more important. Especially for embedded power components it is essential to transport the heat away. Therefore, large heatsink elements are separately manufactured and attached onto the component carrier, for example by thermally conductive adhesive or soldering, in order to transport heat away from the component carrier.

SUMMARY

There may be a need for improved component carriers comprising an effective and compact heatsink.

This need may be met by the subject matter according to the independent claims. Advantageous embodiments of the present invention are described by the dependent claims.

According to a first aspect of an embodiment of the invention, a component carrier is presented. The component carrier comprises a stack having at least one electrically insulating layer structure and/or at least one electrically conductive layer structure. Furthermore, the component carrier comprises an array of exposed highly thermally conductive cooling structures integrally formed with the stack and defining cooling channels in between.

According to a further aspect of the present invention, a method of manufacturing a component carrier is presented. According to the method, a stack comprising at least one electrically insulating layer structure and/or at least one electrically conductive layer structure is formed. Furthermore, an array of exposed highly thermally conductive cooling structures are formed integrally with the stack so that cooling channels are formed between the cooling structures.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

The component carrier comprises the stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane. In the context of the present invention, the term "layer structure" may be a single layer or multilayer assembly.

The highly thermally conductive cooling structures may comprise a material selected of at least one of the group consisting of copper, aluminum and steel. The cooling structures may further comprise a material selected of at least one of the group consisting of silver, nickel, bronze, gold, titanium, tantalum, wolfram, molybdenum and steel.

The conductive cooling structures form protrusions, wherein the cooling channels are formed in between. The cooling structures may be formed the design of cooling edges and cooling fins, respectively. Furthermore, the cooling structures may be formed, as described below, as cooling needles or pillars having for example a circular, elliptical or rectangular cross-section. Hence, the cooling structures form a large dissipation surface, so that a good cooling efficiency may be provided. In other words, by the cooling structure a matrix of copper filled openings (e.g. microvias) can be formed and (dielectric) material of the layer structure around the openings can be removed to allow e.g. air flow. The cooling structure may be placed in a cavity, to reduce thickness (z-dimension) and to avoid handling damage.

By the present invention, the stack (with or without components within) and the array are formed integrally. This means, that the stack and the array are not formed separately in separate manufacturing procedures, wherein later on the finished components, namely the stack and the array, are mounted together in a final manufacturing step. By the present invention, the term integrally formed means to manufacture the stack and the array in one common manufacturing procedure. As described below in further detail, the stack together with its respective vias, signal lines and thermal paths and the array of cooling structures are formed together integrally and not separately in different manufacturing steps.

Hence, by the present invention, no separate and additional heatsinks are necessary so that material and space consumption may be reduced. Furthermore, due to the integrally forming of the heat sink, conductive adhesives, for example, may be eliminated so that a thermal resistance caused by the adhesive may be reduced. Therefore, also the length of the thermal path may be reduced. In addition, the manufacturing process is simplified and material needed is reduced.

According to a further exemplary embodiment, the cooling structures are monolithically integrated in the component carrier. The term "monolithically integrated" means that the cooling structures are monolithically formed within the stack and thermally coupled to a thermal conductive structure of the component carrier, such as copper filled vias or a conductive component layers arranged onto a (e.g. embedded) component. In other words, between the source of the thermal radiation and the thermal dissipation side of the component carrier, there is no separation between the material of the conductive cooling structures and the material of the thermal conductive structures within the component carrier.

According to an exemplary embodiment of the present invention, the cooling structures are formed on and/or in the stack by additive manufacturing, in particular by three-dimensionally printing. Hence, according to an exemplary embodiment of the method, the cooling structures are formed on and/or in the stack by additive manufacturing, in particular by three-dimensionally printing.

In the context of the present application, the term "additive manufacturing" may particularly denote a manufacturing procedure of the array of conductive cooling structures according to which the cooling structures are manufactured by the sequential addition of portions of material which, when taken together, constitute the array of cooling structures. By such an additional manufacturing, stable and specifically thermal conductive formation of the cooling structures is possible without the need to glue the cooling structure to the surface of a layer structure of the stack and hence without the need of further intermediate adhesive layers and the like. Exemplary manufacturing processes for additive manufacturing are described in the following exemplary embodiments below. For example, 3D printing techniques, selective laser sintering (SLS), selective laser melting (SLM) and/or extra procedures can be applied for conducting additive manufacturing.

Hence, different materials can be directly put in the stack up of the respective stack. Unwanted cavity formation during manufacturing may be avoided.

The manufacture of the component carrier and/or the cooling structures may be formed by a 3D print head which is activated or controlled to form the cooling structures integrally and simultaneously with the stack of layer structures. Such a three-dimensional printing may be accomplished on the basis of printing material (such as powder-based techniques material) which is sintered or melted with the metal surface by e.g. spatially limited thermal treatment, for example by a laser. Moreover, it is also possible that the cooling structures are formed by ejecting droplets of melted printing material via a nozzle or the like, such as an extruder device or a plasma spray device, for forming layers of the cooling structures which are solidified after being applied to the layer structure or an already solidified layer of the stack.

In particular, three dimensionally printing as additive manufacturing procedure comprises for example 3D printing with powder, 3D printing with melted materials or 3D printing with fluid materials. 3D printing with powder may particularly denote the use of powder as printing material for the 3D printing. A further process using a printing material e.g. in powder form is selective laser sintering/melting (SLS/SLM), depending whether the delivered local energy is sintering or melting layers together. A further process using printing material in powder form is electron beam melting (EBM, or also called electron beam additive manufacturing EBAM). 3D printing by melt materials may particularly denote fused filament fabrication (FFF) or fused deposition modeling (FDM). Melted materials which will be used for this process may be in particular plastics like ABS or PLA. 3D printing by fluid materials may particularly denote the manufacturing process which is working on the basis of photosensitive fluid, such as fluidic UV-sensitive plastics (photopolymer). In particular, the 3-D printing with fluid materials may denote the so-called stereolithography (SLA). During this process the cooling structure is also formed layer by layer.

By applying additive manufacturing the cooling structures are directly and integrally formed on the layer structures of the stack. Hence, by using an additive manufacturing, the cooling structures are arranged directly on the layer structures of the stack without the need of any intermediate layers between the cooling structures and surface of an already manufactured layer structure of the stack.

The additive manufacturing for forming the cooling structures is highly automated and no assembly of heat spreading structures is necessary later on after finishing the manufacturing steps of the component carrier, since the cooling structures are directly manufactured on the electronic component layer structures of the stack. Additive manufacturing allows the production of heat spreading cooling structures with enhanced thermal conductivity controlled on the microstructural level.

According to a further exemplary embodiment, the cooling structures are located in cavity of the stack so that the cooling structures do not protrude over the cavity. In other words, the stack comprises an outer layer structure comprising a surface directing to the environment of the component carrier. The outer layer structure is defined within a plane. Hence, through the outer layer structure, the cavity is formed. Hence, the cooling structure, such as a plurality of spaced pillars or needles, protrudes through the cavity to the outer layer structure without protruding above the outer surface of the outer layer structure in the environment.

Additionally or alternatively, at least a part of the cooling structures is formed "on top", in particular on an outer surface, of the stack, e.g. by additive manufacturing.

According to a further exemplary embodiment, the cooling structures are formed in an interior of the stack with at least one layer structure above and at least one layer structure below the cooling structures. Hence, the cooling structures are embedded within the stack, wherein the cooling channels between the cooling structures comprise an inlet and an outlet to the environment of the component carrier, so that for example a cooling fluid may stream through the cooling channels for transporting heat out of the component carrier.

For example, the component carrier is formed of three stacks, wherein the middle stack comprising the thermally conductive cooling structure is sandwiched between the other two stacks. Hence, the middle stack may be formed integrally with the thermally conductive cooling structure and the covering stacks surrounds the array of conductive cooling structures.

According to a further exemplary embodiment, the cooling structures are integrated in material of the stack without connection medium in between, i.e. between the cooling structures and the stack. For example, by the above described additive manufacturing or by a common plating process, the cooling structures are integrated and hence form together with the stack.

Hence, any heat resistive layers reducing the heat dissipation from e.g. the component are avoided. For example, if the cooling structures and a surface of the heat generating components are made of thermally conductive material, such as metal, a metal to metal bond is provided between the cooling structures functioning as a heat sink and the metal surface on the component, avoiding any glue, tape or thermal interface material (TIM), so that it may be possible to enhance the heat conductivity of current available heat sink mount technologies.

According to a further exemplary embodiment, the cooling structures are pillars, in particular copper pillars. The cooling needles or pillars may form for example a circular, elliptical or rectangular cross-section. Hence, the cooling structures form a large dissipation surface, so that a good cooling efficiency may be provided. The cooling structures may be also formed like cooling edges and cooling fins, respectively.

The pillars (and also the cooling fins) form protrusions in order to increase the overall surface area of the cooling structure. Hence, the overall surface area provides a larger surface so that the thermal conductivity with the environment of the component carrier can be provided. Specifically, by additive manufacturing small and complex three-dimensional fin shapes can be manufactured.

According to a further exemplary embodiment, the cooling channels are configured for at least partially surrounding the cooling structures with a cooling medium, in particular air or a liquid, such as water.

According to an exemplary embodiment of the manufacturing method of the component carrier, the step of forming the array of exposed highly thermally conductive cooling structures comprises applying a sacrificial structure on the stack, forming openings in the sacrificial structure, filling the openings with the highly thermally conductive material, and removing the sacrificial structure.

Hence, for example as a first step a sacrificial structure is applied on the stack and in particular in the cavity of the stack. The sacrificial structure may be a laser drillable and/or a copper-platable material. Furthermore, the sacrificial structure may be a photoresist material which may be removed by e.g. (ultraviolet) radiation or etching. Accordingly, a pattern of openings are formed in the sacrificial structure by radiation or etching at locations, where respective cooling structure should be formed. Next, the openings are filled with the highly thermally conductive material, such as copper. Thereby the openings are plated with the thermal conductive material. For example, after plating the openings, a part of the thermally conductive material may be removed (stripped). Next, the sacrificial structure is removed. Hence, after removing the sacrificial structure, the cooling channels are defined between the thermally conductive cooling structures.

The sacrificial structure may be a dry film, in particular a photo dry film. The dry film may be placed on the stack or in the cavity of the stack and the respective openings may be formed in the dry film by radiation.

For example, the stack may be formed of an epoxy material (with or without fibres, such as glass fibres) or a photoresist material.

Furthermore, openings can be formed directly in the stack, wherein the openings are formed with a desired pattern indicative to a pattern of the cooling structure. For example, if the stack is formed of a photoresist material, the sacrificial structure may be resistant with respect to an etchant or a defined radiation. Hence, by etching or by radiation, the material of the stack which is not covered by the sacrificial layer is removed for forming defined openings within the stack. Next, the openings are subsequently filled with copper. In a further step, the sacrificial layer is removed such that the material of the stack is no longer covered by the sacrificial layer. Next, in a further step the material between the copper (i.e. the thermally conductive material) filled openings is removed, for example by drilling, etching or radiation, so that the material of the stack between the copper filled openings is removed and the cooling channels between the cooling structures are thereby formed.

According to a further exemplary embodiment of the manufacturing method, an upper stack made of at least one electrically insulating layer structure and/or at least one electrically conductive layer structure is formed. Furthermore, a lower stack made of at least one electrically insulating layer structure and/or at least one electrically conductive layer structure is formed. The stack is sandwiched between the lower stack and the upper stack. Next, the stack, the lower stack and the upper stack are fixed together, in particular by a lamination procedure (i.e. by applying heat and pressure to the respective stacks).

Hence, the cooling structures are formed in an interior closed cavity of the stack with an upper stack above and at least one layer structure, e.g. a lower stack, below the cooling structures. Hence, the cooling structures are embedded, wherein the cooling channels between the cooling structures comprise an inlet and an outlet to the environment of the component carrier, so that for example a cooling fluid may stream through the cooling channels for transporting heat out of the component carrier.

Hence, the manufactured component carrier is formed of separate stacks, wherein the middle stack comprising the thermally conductive cooling structure is sandwiched between the other two stacks. Hence, the middle stack may be formed integrally with the thermally conductive cooling structure and the covering stacks surrounds the array of conductive cooling structures.

The stacks may be formed of a low-flow material. Hence, first of all, the conductive structures, such as the vias and the cooling structure, may be formed within the respective stacks. In a next step, the three stacks are formed together. By using "low-flow material" for the respective stacks, the stacks can be laminated together by applying heat and pressure without the risk that liquid material for example of the upper or lower stacks flows with in the cavity due to the thermal treatment within the lamination procedure.

In the context of the present application, the term "low-flow material" (sometimes also denoted as "no-flow material") may particularly denote material which has no or only a very limited tendency to flow during processing under external pressure and elevated temperature, in particular during lamination. In particular, low-flow material may have a sufficiently high viscosity, for instance at least 5000 Poise, preferably at least 10000 Poise, at lamination temperature (for instance 150° C.). For example, when ordinary prepreg is heated under pressure, its resin melts (liquefies) and freely flows in any voids in the environment. There is a certain period of time during which the resin of ordinary prepreg remains fluidic enough to flow freely. In contrast to this, low-flow material as implemented in accordance with exemplary embodiments of the invention is specifically configured to suppress or even eliminate flow during lamination, so that the low-flow material substantially rests in place during lamination. However, the "low-flow material" or "no-flow material" may still be at least partially uncured when being provided prior to lamination. Such a no-flow prepreg or low-flow prepreg has the tendency of substantially not flowing into the region of the step when connecting the no-flow prepreg or low-flow prepreg with other layer structures during lamination. In the presence of thermal energy and/or pressure, an ordinary prepreg may re-melt and the corresponding resin may flow into tiny gaps during lamination. After a corresponding cross-linking procedure of the resin is completed, the resin is re-solidified and then remains spatially fixed. If ordinary prepreg is used for the component carrier according to an exemplary embodiment of the invention, care should be taken to prevent excessive flow of resin into a region (such as the below described indentation) which should be kept free of resin for forming the step. However, when using low-flow prepreg or no-flow prepreg, such potential issues are overcome by preventing the flow of resin into a gap which shall remain free of material for properly defining the step.

According to a further exemplary embodiment, the component carrier further comprises a component, in particular an electronic component, mounted on and/or embedded in the stack, wherein the component is in particular thermally coupled to the cooling structure.

The at least one component can be selected from a group consisting of an electrically non-conductive inlay, an electrically conductive inlay (such as a metal inlay, preferably comprising copper or aluminum), a heat transfer unit (for example a heat pipe), a light guiding element for example an optical waveguide or a light conductor connection, an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, an energy harvesting unit and discrete power devices such as simple switches, transistors, MOSFET, IGBT. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

According to a further exemplary embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supraconductive material such as graphene.

According to a further exemplary embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

Layer structures of the component carrier may be formed by an electroless nickel plating (EN), in particular layer structures of the first surface finish and/or the second surface finish, more particular the first layer structure of the first surface finish and/or the second layer structure of the first surface finish.

This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

According to an exemplary embodiment, the component carrier is configured as one of the group consisting of a printed circuit board, and a substrate. In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1:
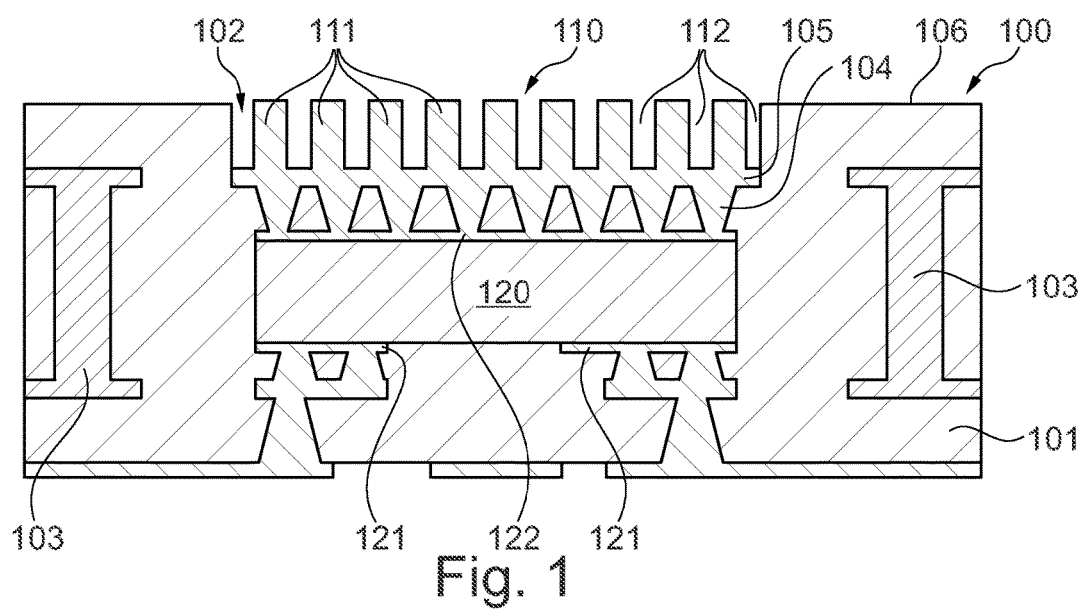
FIG. 1 shows a schematic drawing of a component carrier comprising a component coupled to an array of exposed highly thermally conductive cooling structures according to an exemplary embodiment of the present invention.

The aspects defined above and further aspects of the invention are apparent from the examples of embodiment to be described hereinafter and are explained with reference to these examples of embodiment.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different than those illustrated in the figures when in use.

FIG. 1 shows a component carrier 100 comprising a component 120 coupled to an array 110 of exposed highly thermally conductive cooling structures 111 according to an exemplary embodiment of the present invention.

The component carrier 100 comprises a stack 101 having at least one electrically insulating layer structure and/or at least one electrically conductive layer structure. Furthermore, the component carrier 100 comprises the array 110 of exposed highly thermally conductive cooling structures 111 integrally formed with the stack 101 and defining cooling channels 112 in between.

The component carrier 110 is a support structure which is capable of accommodating one or more components 120 thereon and/or therein for providing mechanical support and/or electrical or thermal connectivity provided for example by the shown pads 121 and vias 104. The component carrier 100 comprises the stack 101 of at least one electrically insulating layer structure and at least one electrically conductive layer structure. The layer structures of the component carrier 100 denote a continuous layer, a patterned layer or a plurality of non-consecutive islands within a common plane.

The highly thermally conductive cooling structures 111 may comprise a thermal conductive material, such as copper. The conductive cooling structures 111 form protrusions, wherein the cooling channels 112 are formed in between. The cooling structures 111 are formed in the exemplary embodiment like needles or pillars having for example a circular, elliptical or rectangular cross-section. Hence, the cooling structures 111 form a large dissipation surface, so that a good cooling efficiency may be provided.

The pillars (and also the cooling fins) form protrusions in order to increase the overall surface area of the cooling structure. Hence, the overall surface area provides a larger surface so that the thermal conductivity with the environment of the component carrier can be provided. Specifically, by additive manufacturing small and complex three-dimensional fin shapes can be manufactured.

The stack 101 and the array 111 are formed integrally. The stack 101 and the array 111 are therefore formed in one common manufacturing procedure. The stack 101 together with its respective vias 104, signal lines (pads 121) and the array 110 of cooling structures 111 are formed together integrally and not separately in different manufacturing steps.

As can be taken from FIG. 1, the cooling structures 111 are monolithically integrated in the component carrier 100. The cooling structures 111 are monolithically formed within the stack 101 and thermally coupled to a thermal conductive structure of the component carrier, such as copper filled vias 104 or a conductive component layers 122 arranged onto a (e.g. embedded) component 120. The cooling structures 111 are formed on and/or in the stack 101 e.g. by additive manufacturing, in particular by three-dimensionally printing.

The cooling structures 111 are located in cavity 102 of the stack 101 so that the cooling structures 111 do not protrude over the cavity as can be taken from FIG. 1. In other words, the stack 101 comprises an outer layer structure comprising a surface 106 directing to the environment of the component carrier 100. The outer layer structure and its surface 106 is defined within a plane. Hence, through the outer layer structure, the cavity 102 is formed and accessible. Hence, the cooling structure 111, such as a plurality of spaced pillars, protrudes through the cavity 102 to the outer layer structure without protruding above the outer surface 106 of the outer layer structure in the environment.

The cooling structures 111 are integrated in the material of the stack 101 without connection medium in between, i.e. between the cooling structures 111 and the stack 101. As can be taken in FIG. 1, between the component 120 and the outer end of the cooling structures 111, no connection layers, such as adhesive layers, are necessary. During the manufacturing process, the thermal conductive component layer 122, the vias 104, the thermal conductive layer 105 and the cooling structures 111 may be formed in one material (such as copper) filling step.

For example, first of all the component 120 may be embedded in the stack 101. Next, layer structures of the stack 101, for example a prepreg layer, may be arranged on top of the component 120 providing a gap in which the thermal conductive component layer 122 may be filled later on. Next, the holes for the vias 104 may be drilled, for example by mechanical drilling or by a laser drilling. In a next step, for example the drilled holes and the gap are filled with copper. As a further example, a plating procedure may be applied for providing thermally conductive material was in the openings.

Furthermore, a sacrificial structure may be applied on the stack 101, in particular in the cavity 102 of the stack 101. In the sacrificial structure, which may be a dry film, a pattern of openings are formed. The openings are arranged with a predefined pattern indicative of the pattern of thermal conductive structures 111 to be formed. Next, respective openings are formed with in the stack 101 by etching (or by radiation, if the stack 101 comprises photoresist material). Next, the highly thermally conductive material, such as copper, is filled in the openings for forming the thermal conductive structures 111. In this step, the thermally conductive material may also not only fill the openings, but also for example the above described gap and the vias 104. This results in that between the component 120 and the outer ends of the cooling structures 111 one common monolithically formed filling consisting of thermally conductive material is provided. Hence, any heat resistive layers reducing the heat dissipation from e.g. the component are avoided.

The next step, the sacrificial structure may be removed for example by drilling, etching or radiation, such that the cooling channels between the cooling structures are formed.

The cooling channels 112 are configured for at least partially surrounding the cooling structures 111 with a cooling medium, in particular air or a liquid, such as water.

Hence, the component carrier 100 of FIG. 1 comprises the embedded components 120 which generates heat. The component 120 may be for example a power module. Along the upper surface of the component 120 the thermal conductive component layer 122 consisting for example of copper is arranged in order to provide a large heat dissipation area. Above the thermal conductive component layer 122 further layer structures of the stack 101 are arranged. Between the thermal conductive component layer 122 and the thermal conductive layer 105 a plurality of vias 104 filled with copper are formed in order to guide the heat from the thermal conductive component layer 122 to the thermal conductive layer 105. Between the environment and the thermal conductive layer 105 the array 110 of spaced apart cooling structures 111, formed like pillars, are formed. The cooling structures 111 are arranged within the open cavity 102 of the stack 101, such that the cooling structures 111 can be embedded within the cavity 102 and do not protrude outside of an outer surface 106 of the stack 101. Between the cooling structures 111 plurality of cooling channels 112 are formed such that a cooling medium, such as air or water, can flow through the cooling channels 112 to guide the heat away.

On the side of the component 120 opposed to the thermal conductive component layer 122 pads 121 are formed for providing a signal coupling to the component 120. The pads 121 may be electrically coupled to an outer electrically conductive line for functionally coupling the component 120. Furthermore, additional pads 121 can be formed on the side of the component 120, where the thermally conductive component layer 122 is arranged. Additionally, further electrically and/or thermally conductive structures 103 may be embedded within the stack 101.

Figure 2:
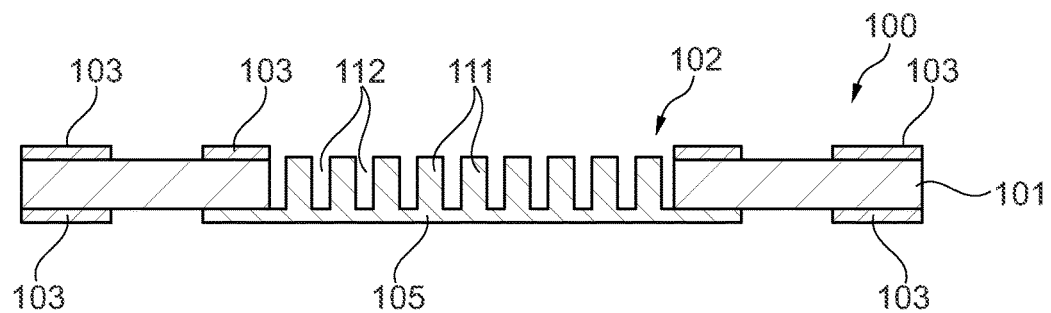
FIG. 2 shows a schematic drawing of a component carrier comprising an array of exposed highly thermally conductive cooling structures according to an exemplary embodiment of the present invention.

FIG. 2 shows a schematic drawing of a component carrier 100 comprising an array 110 of exposed highly thermally conductive cooling structures 111 according to an exemplary embodiment of the present invention. The component carrier 100 comprises a stack 101 having at least one electrically insulating layer structure and/or at least one electrically conductive layer structure. Furthermore, the component carrier 100 comprises the array 110 of exposed highly thermally conductive cooling structures 111 integrally formed with the stack 101 and defining cooling channels 112 in between.

The component carrier 100 may be a printed circuit board (PCB) comprising several further conductive structures 103. In the stack 101 of the component carrier 100 cavity 102 is formed. The cavity 102 is closed on one side by a thermal conductive layer 105. From the conductive layer 105 the cooling structure 111 protrudes through the cavity 102. Hence, heat generated in the vicinity of the summer conductive layer 105 be guided effectively through the stack 101 to the opposite side of the stack 101.

Figure 3:
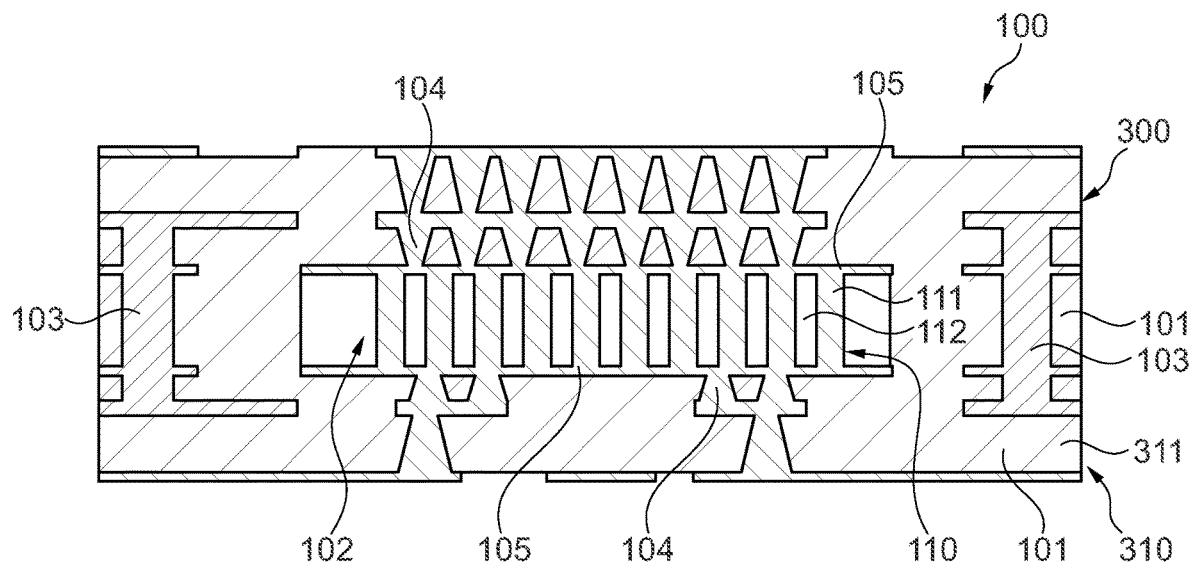
FIG. 3 shows a schematic drawing of a component carrier comprising an array of exposed highly thermally conductive cooling structures surrounded by the stack according to an exemplary embodiment of the present invention.

FIG. 3 shows a schematic drawing of a component carrier 100 comprising an array 110 of exposed highly thermally conductive cooling structures 111 surrounded by the stack 101 according to an exemplary embodiment of the present invention. The cooling structures 111 are formed in an interior closed cavity 102 of the stack 101 with upper stack 300 above and at least one layer structure, e.g. a lower stack 310, below the cooling structures 111. Hence, the cooling structures 111 are embedded, wherein the cooling channels 112 between the cooling structures 111 comprise an inlet and an outlet to the environment of the component carrier 100, so that for example a cooling fluid may stream through the cooling channels 102 for transporting heat out of the component carrier 100.

For example, the component carrier 100 is formed of separate stacks 101, 300, 310, wherein the middle stack 101 comprising the thermally conductive cooling structure 111 is sandwiched between the other two stacks 300, 310. Hence, the middle stack 101 may be formed integrally with the thermally conductive cooling structure 111 and the covering stacks 300, 310 surrounds the array 110 of conductive cooling structures 111.

The cooling structures 111 are formed between two opposing thermal conductive layers 105 and thereby extend through the cavity 102. On top of one of the thermal conductive layers 105 vias 104 formed within the upper stack 300 are connected. On top of the other one of the thermal conductive layer 105 vias 104 formed within the lower stack 310 are connected. Hence, for example a full copper layer (thermal conductive layer 105) is arranged on both sides of the cooling structure.

The stacks 100, 300, 310 may be formed of a low-flow material. Hence, first of all, the conductive structures, such as the vias 104 and the cooling structure 111, may be formed within the respective stacks 100, 300, 310. In a next step, the three stacks 100, 300, 310 are formed together. In particular, when using "low-flow material" for the respective stacks 100, 300, 310, the stacks 100, 300, 310 can be laminated together without the risk that liquid material for example of the upper or lower stacks 300, 310 flows with in the cavity 102 due to the thermal treatment within the lamination procedure.

It should be noted that the term "comprising" does not exclude other elements or steps and the use of articles "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

LIST OF REFERENCE SIGNS 100 component carrier
101 stack
102 cavity
103 further conductive structure
104 via
105 thermal conductive layer
106 surface
110 array
111 cooling structure
112 cooling channel
120 component
121 pad
122 thermal conductive component layer
300 upper stack
310 lower stack

The invention claimed is:

1. A component carrier, comprising:
a stack comprising at least one electrically insulating layer structure and/or at least one electrically conductive layer structure;
a cooling structure including an array of exposed highly thermally conductive cooling structures, a first conductive layer, conductive structures, and a thermally conductive component layer;
wherein each of the exposed highly thermally conductive cooling structures is formed as a pillar, wherein the array of exposed highly thermally conductive cooling structures is integrally formed within a cavity of the stack without protruding over the cavity, and
wherein the array of exposed highly thermally conductive cooling structures defines cooling channels between the pillars for a cooling medium to flow through;
the conductive structures comprising at least a via wherein the first conductive layer is a continuous layer arranged as an interface between the array of exposed highly thermally conductive cooling structures and the conductive structures, and
a thermally conductive component layer contacting an entire main surface of the source of thermal radiation, wherein heat is guided from the source of thermal radiation to the array of exposed highly thermally conductive cooling structures.

2. The component carrier according to claim 1, wherein the cooling structures of the array of exposed highly thermally conductive cooling structures are formed on and/or in the stack by additive manufacturing.

3. The component carrier according to claim 1, wherein the cooling structures of the array of exposed highly thermally conductive cooling structures are formed in an interior of the stack with at least one layer structure above and at least one layer structure below the cooling structures of the array of exposed highly thermally conductive cooling structures.

4. The component carrier according to claim 1, further comprising:
the cooling medium in a channel of the cooling channels at least partially surrounding the array of exposed highly thermally conductive cooling structures.

5. The component carrier according to claim 1, further comprising:
a component mounted on and/or embedded in the stack, wherein the component is thermally coupled to the cooling structures of the array of exposed highly thermally conductive cooling structures.

6. The component carrier according to claim 5, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

7. The component carrier according to claim 1, wherein the at least one electrically conductive layer structure comprises at least one of the group consisting of copper, aluminum, nickel, silver, gold, palladium, and tungsten, the at least one electrically conductive layer structure at least partially coated with graphene.

8. The component carrier according to claim 1, wherein the at least one electrically insulating layer structure comprises at least one of the group consisting of resin, reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, ceramic, and a metal oxide.

9. The component carrier according to claim 1,
wherein the component carrier is shaped as a plate.

10. The component carrier according to claim 1,
wherein the component carrier is configured as one of the group consisting of a printed circuit board, and a substrate.

11. The component carrier according to claim 1,
configured as a laminate-type component carrier.

12. The component carrier according to claim 1,
wherein the cooling structures of the array of exposed highly thermally conductive cooling structures are manufactured by applying a sacrificial structure on the stack, forming openings in the sacrificial structure, filling the openings with the highly thermally conductive material and removing the sacrificial structure.

* * * * *